United States Patent
Tsujimoto et al.

(10) Patent No.: US 7,686,916 B2
(45) Date of Patent: Mar. 30, 2010

(54) SHEET PEELING APPARATUS AND PEELING METHOD

(75) Inventors: Masaki Tsujimoto, Tokyo (JP); Takahisa Yoshioka, Tokyo (JP)

(73) Assignee: Lintec Corporation, Tokyo (JP)

( * ) Notice: Subject to any disclaimer, the term of this patent is extended or adjusted under 35 U.S.C. 154(b) by 1008 days.

(21) Appl. No.: 10/577,258

(22) PCT Filed: Oct. 21, 2004

(86) PCT No.: PCT/JP2004/015581

§ 371 (c)(1),
(2), (4) Date: Apr. 26, 2006

(87) PCT Pub. No.: WO2005/041282

PCT Pub. Date: May 6, 2005

(65) Prior Publication Data

US 2009/0014124 A1      Jan. 15, 2009

(30) Foreign Application Priority Data

Oct. 27, 2003    (JP) .............................. 2003-365859

(51) Int. Cl.
*B32B 38/10* (2006.01)
(52) U.S. Cl. ..................... 156/344; 156/247; 156/584
(58) Field of Classification Search ................. 156/247, 156/344, 584
See application file for complete search history.

(56) References Cited

U.S. PATENT DOCUMENTS 5,310,442 A    5/1994   Ametani (Continued)

FOREIGN PATENT DOCUMENTS

EP         1 128 415 A2     8/2001

(Continued)

OTHER PUBLICATIONS

International Search Report of International Application PCT/JP2004/015581 mailed Feb. 1, 2005.

(Continued)

*Primary Examiner*—Mark A Osele
(74) *Attorney, Agent, or Firm*—Westerman, Hattori, Daniels & Adrian, LLP

(57) ABSTRACT

There is provided a sheet peeling apparatus and a peeling method using a plurality of peeling units. A sheet peeling apparatus for peeling off a sheet stuck on the surface of a semiconductor wafer by using an adhesive tape of a width narrower than that of the sheet, which is equipped with a peeling head for peeling off the sheet by pulling the adhesive tape in an obtuse angled direction in a state stuck to the end portion of the sheet; and first and second rollers for peeling off the sheet by pulling the adhesive tape in the substantially right angle or acute angle direction in a state stuck with the adhesive tape in the direction across the sheet. Either of the peeling units are selectively used in accordance with the type of the sheet.

9 Claims, 10 Drawing Sheets

U.S. PATENT DOCUMENTS

| | | | |
|---|---|---|---|
| 6,149,758 | A | 11/2000 | Tsujimoto et al. |
| 6,500,291 | B1 * | 12/2002 | Okada et al. ............. 156/230 |
| 6,966,966 | B2 | 11/2005 | Koizumi et al. |
| 7,172,673 | B2 | 2/2007 | Kurosawa et al. |
| 2004/0238118 | A1 * | 12/2004 | Miyamoto ............. 156/344 |

FOREIGN PATENT DOCUMENTS

| | | |
|---|---|---|
| JP | 4-336428 | 11/1992 |
| JP | 6-302572 | 10/1994 |
| JP | 11-16862 | 1/1999 |
| JP | 2003-197583 | 7/2003 |

OTHER PUBLICATIONS

Chinese Office Action issued in corresponding Chinese patent application No. 200480030831.8.

European Patent Office Communication dated Dec. 10, 2009 with Supplementary European Search Report dated Dec. 3, 2009 issued in corresponding European Patent Application No. 04792731.4-1226.

* cited by examiner

SHEET PEELING APPARATUS AND PEELING METHOD

FIELD OF THE INVENTION

The present invention relates to a sheet peeling apparatus and a peeling method, more particularly to a sheet peeling apparatus and a peeling method capable of changing the peeling mode in accordance with the type of sheet.

BACKGROUND OF THE INVENTION

In the semiconductor manufacturing process, there is employed a process to grind the rear surface of semiconductor wafer (hereinafter simply referred to as "wafer") into a thin thickness. In the grinding process, the surface of the wafer (circuit forming surface) is stuck with a protective sheet to cover the same, and after completing the grinding operation in this state, the protective sheet is peeled off from the wafer.

As for a peeling apparatus for the protective sheet, for example, as disclosed in the Patent document 1, Japanese Patent Application Laid-open No. Hei 11-16862, there is known an apparatus in which an adhesive tape is stuck to the end portion of protective sheet; and by pulling the adhesive tape, the protective sheet is peeled off from the wafer. And as disclosed in the Patent document 2, Japanese Patent Application Laid-open No. 2003-197583, there is known an apparatus in which an adhesive tape is stuck in a direction across a protective sheet; and by pulling the adhesive tape, the protective sheet is peeled off from the wafer.

The peeling apparatus disclosed in the Patent document 1 employs an arrangement such that the adhesive tape is stuck to the end portion of the wafer in a manner of heat fusion sticking. Therefore, even when grinding dust of the wafer adheres onto the protective sheet, the connection between the adhesive tape and the protective sheet is possible without being affected by the grinding dust. However, this peeling apparatus has the following disadvantages. That is, when a protective sheet having a high stress absorbing property i.e., a protective sheet of a soft material is used, sometimes the protective sheet spreads out and drops down to stick to a dicing tape on which the wafer stuck and supported thereby; thus, the material for the protective sheet is limited. Further, since this arrangement employs the heat fusion sticking, in this point also the material for the protective sheet is limited. Furthermore, the protective sheet peeling angle according to the Patent document 1 turns over the protective sheet in an obtuse angle direction of almost 180°. Therefore, in the case where, in order to satisfactorily hold the extremely thin wafer, a rigid protective sheet, for example, a thick protective sheet is employed, the peeling itself is difficult.

On the other hand, in the arrangement according to the Patent document 2, the protective sheet is peeled off by using a peeling roller movable in the direction across the protective sheet while rotating on the protective sheet. In this arrangement also, the protective sheet is peeled off in an obtuse angle direction. Therefore, the arrangement according to the Patent document 2 also has a disadvantage such that, when a rigid protective sheet is stuck on the wafer, the protective sheet is difficult to be peeled off satisfactorily.

SUMMARY OF THE INVENTION

The present invention has been proposed in view of the above-described disadvantages. An object of the present invention is to provide a sheet peeling apparatus and a peeling method capable of peeling off under perfect conditions using a plurality of peeling units having different peeling angles in accordance with the differences in material, thickness and the like of the protective sheet.

In order to achieve the above object, the present invention adopts the following arrangement; i.e., a sheet peeling apparatus for peeling off a sheet being stuck on a plate-like object using an adhesive tape, which includes:

a first roller capable of performing relative movement along the external surface of the sheet, and a second roller disposed adjacent to the first roller and capable of performing a relative movement along with the first roller, wherein, the second roller is positioned at the position opposite to the travel direction of the first roller in a peeling operation, and is disposed at a position further away than the first roller with respect to the surface of the sheet.

Also, the present invention adopts the following arrangement; i.e., a sheet peeling apparatus for peeling off a sheet being stuck on a plate-like object using an adhesive tape, including:

a first peeling unit that pulls the adhesive tape along the direction across the sheet in a state stuck to the sheet to peel off the sheet at a predetermined peeling angle; and a second peeling unit that pulls the adhesive tape in a state stuck to the end portion of the sheet to peel off the sheet at a peeling angle different from the peeling angle of the first peeling unit, wherein the first and second peeling units are arranged to be selectively used.

Further, the present invention may adopt the following arrangement; i.e., a sheet peeling apparatus for peeling off a sheet being stuck to cover the surface of a semiconductor wafer having a substantially disk-like shape using an adhesive tape with a width smaller than the diameter of the sheet, including:

a first peeling unit that pulls the adhesive tape along the direction across the sheet in a state stuck to the sheet to peel off the sheet at a predetermined peeling angle; and a second peeling unit that pulls the adhesive tape in a state stuck to the end portion of the sheet to peel off the sheet at a peeling angle different from that of the first peeling unit, wherein the first and second peeling units are arranged to be selectively used.

In the sheet peeling apparatus, the following arrangement is adopted; i.e., the first peeling unit peels off the sheet in the direction substantially right angle or acute angle with respect to the surface of the plate-like object.

Also, the following arrangement is adopted; i.e., the second peeling unit peels off the sheet at a peeling angle larger than that by the first peeling unit.

Further, the present invention adopts the following sheet peeling method; i.e., a sheet peeling method of peeling off a sheet stuck on a plate-like object using an adhesive tape, including:

a first roller capable of performing a relative movement along the external surface of the sheet; and a second roller disposed adjacent to the first roller and capable of relative movement along with the first roller, wherein, in a state that the second roller is positioned at the position opposite to the travel direction of the first roller at peeling operation, and disposed at a position further away than the first roller with respect to the surface of the sheet the first and second rollers and the sheet are caused to make a relative movement simultaneously along the external surface of the sheet to peel off the sheet.

Furthermore, the present invention adopts the following sheet peeling method; i.e., a sheet peeling method of peeling off a sheet stuck on a plate-like object using an adhesive tape, including:

a first peeling unit that pulls the adhesive tape along the direction across the sheet in a state stuck to the sheet to peel off the sheet at a predetermined peeling angle; and a second peeling unit that pulls the adhesive tape in a state stuck to the end portion of the sheet to peel off the sheet at a peeling angle different from that of the first peeling unit, wherein the first and second peeling units are selectively used to peel off the sheet.

In the above methods, the following method is preferably adopted; i.e., the first peeling unit peels off the sheet in the substantially right angle or acute angle direction with respect to the surface of the plate-like object, and the second peeling unit peels off the sheet at a peeling angle larger than that by the first peeling unit.

According to the sheet peeling apparatus in accordance with the present invention, the second roller is disposed at a position further away than the first roller with respect to surface of the sheet. Therefore, even when the peeled sheet hangs from the both sides in the width direction of the adhesive tape, the peeled sheet is prevented from sticking to the dicing tape stuck to a wafer to support the same. Thus, the sheet can be peeled off efficiently without interrupting the peeling operation.

Here, the first roller may be changed with a roller having a different diameter. For example, a roller having a larger diameter is employed, compared to the case where a roller having a relatively smaller diameter is used, a smoother curved surface can be obtained on the peripheral surface, and which is particularly suitable for a protective sheet having a high rigidity.

Further, the sheet-peeling angle is different between the first peeling unit and the second peeling unit. Therefore, for example, in the case where the plate-like object such as a wafer is stuck with a protective sheet, which has a thickness hard to be pulled in a state being turned in an obtuse direction; i.e., when the protective sheet is hardly turned over in an obtuse angle due to the rigidity of the sheet, by using the first peeling unit which is set to a peeling angle of substantially right angle or acute angle, a smooth peeling off can be carried out. On the other hand, in the case where the protective sheet is formed of a thickness or material allowing the protective sheet to be pulled in an obtuse direction to peel off, the protective sheet can be peeled off by using the second peeling unit resulting in a reduction of the consumption of the adhesive tape.

Figure 7:
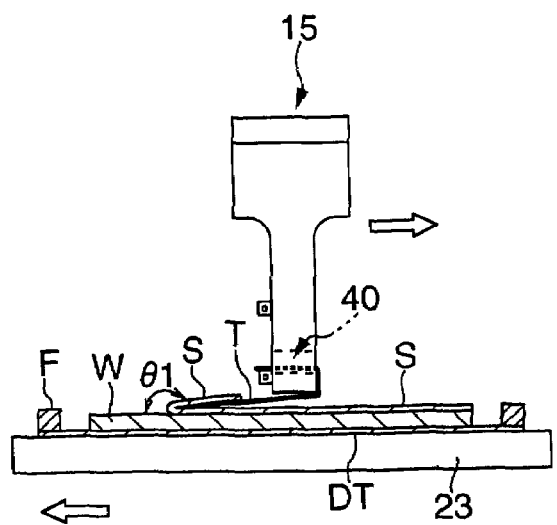
FIG. 7 is a front elevation view of the essential part illustrating a state the peeling head peels off the protective sheet in an obtuse angle direction.
Figure 13:
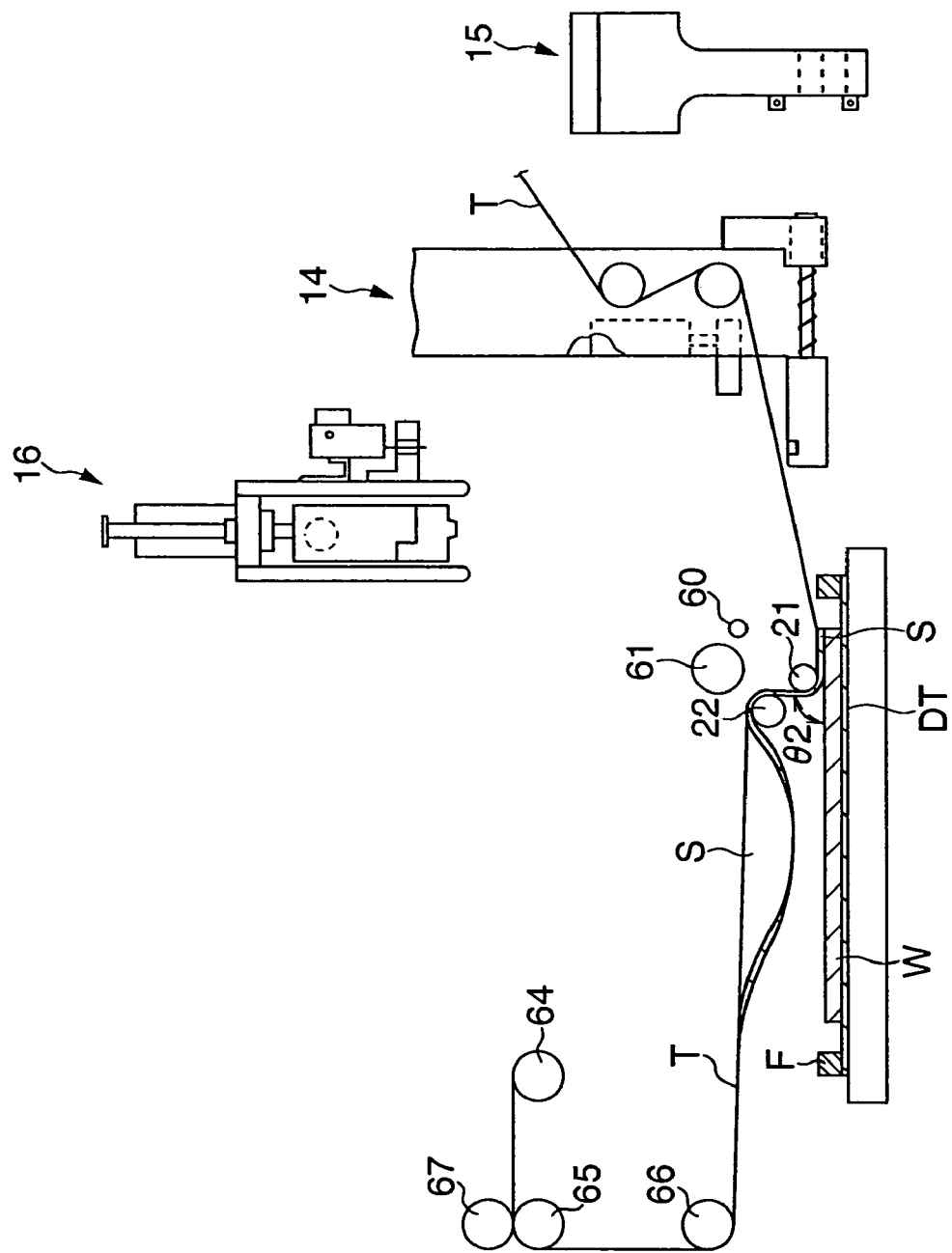
FIG. 13 is a front elevation view of the essential part illustrating a state the first and second rollers peel off the protective sheet in an acute angle direction.

In this specification, the wording, "peeling angle" is used for the angles indicated by $\theta 1$, $\theta 2$ in FIG. 7 and FIG. 13.

DETAILED DESCRIPTION OF THE INVENTION

Hereinafter, preferred embodiments of the present invention will be described with reference to the drawings.

Figure 1:
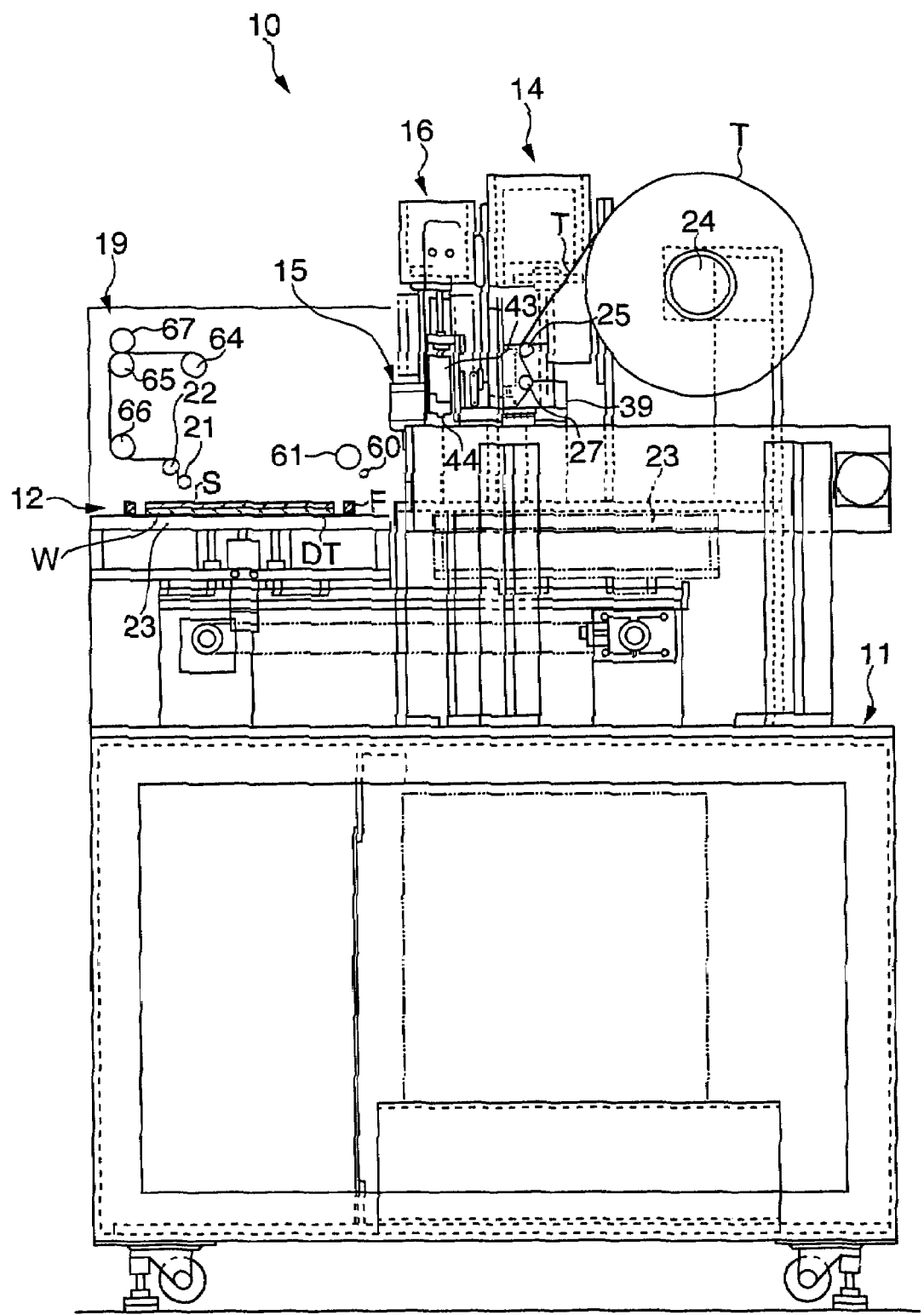
FIG. 1 is a front elevation view schematically showing a sheet peeling apparatus according to the present embodiment.

FIG. 1 is a front elevation view schematically showing a sheet peeling apparatus in accordance with the present embodiment. Referring to FIG. 1, a sheet peeling apparatus 10 includes a base 11, a wafer holding mechanism 12 disposed on the base 11 so as to be movable in the horizontal direction in FIG. 1 for holding a wafer W, which has a substantially disk-like shape as a plate-like object on the upper face side thereof, a feed-out section 14 of an adhesive tape T for peeling off a sheet, i.e., a protective sheet S stuck on the surface of the wafer W, a peeling head 15 (a second peeling unit) for pulling the protective sheet S in a state holding the adhesive tape T, a heater cutter unit 16 having a function to stick the adhesive tape T to the end portion of the protective sheet S in a manner of fusion-bonding and cut off the adhesive tape T at a position slightly upper stream side than the fusion-bond area, and first and second rollers 21 and 22 constituting a first peeling unit disposed at the front face side (the side toward you in FIG. 1) of a supporting member 19 formed of a plate member, a frame or the like disposed in the left side area of the peeling head 15 in FIG. 1. Here, the adhesive tape T, which has a strip shape with a width narrower than the diameter of the protective sheet S stuck on the circuit face side of the wafer W (the upper face side in FIG. 1), is used.

The holding mechanism 12 includes a table 23, and the table 23 is arranged so that the wafer W, which is stuck and fixed to the inside area of a ring frame F via a dicing tape DT, is placed along with the ring frame F. To be more specific, the table 23 is arranged in such a manner that it is formed with a suction hole (not shown), and when a predetermined decompression pump is activated to suck the air above the suction hole, the dicing tape DT and the ring frame F are sucked and held thereon.

Figure 2:
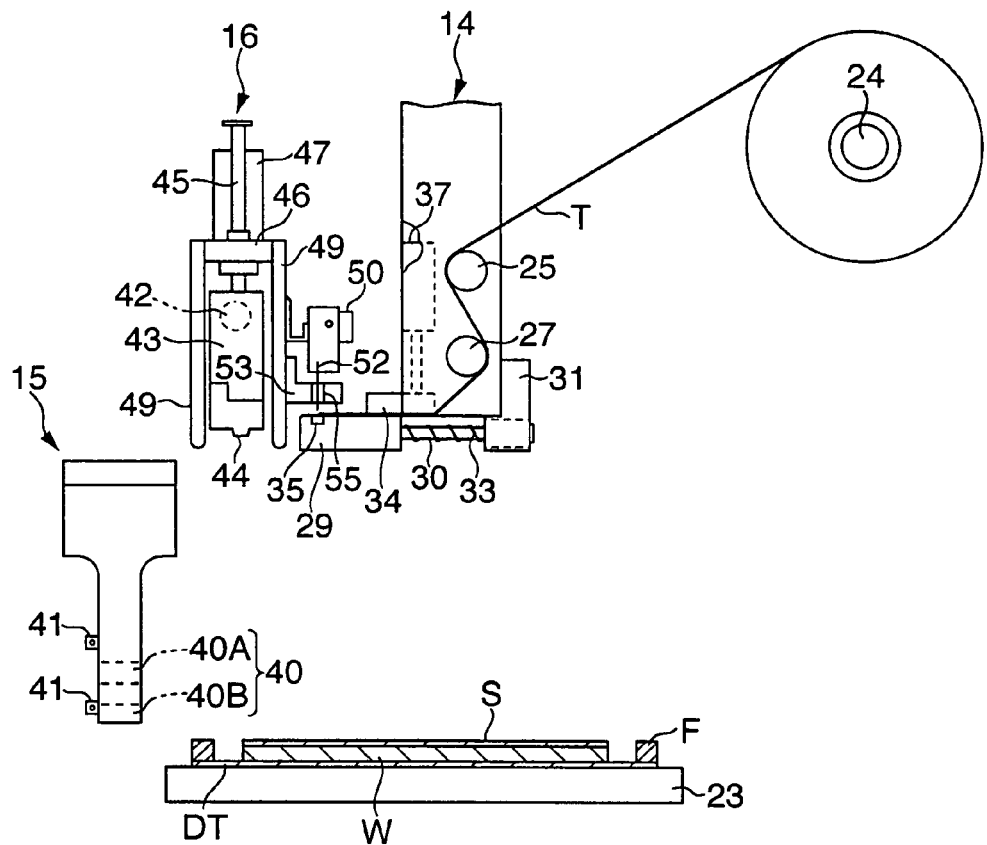
FIG. 2 is a front elevation view schematically showing an essential part including a peeling head constituting a second peeling unit.

The feed-out section 14 includes a holding roller 24 for a roll-like adhesive tape T and guide rollers 25 and 27 as shown in FIG. 2. In the lower end side of the feed-out section 14, a tape receiving plate 29 is attached to a ball bush 31 via a shaft 30. The tape receiving plate 29 is movable in the horizontal direction in FIG. 2, and is constantly biased by a spring 33 in its protruding direction (leftward) and formed with a cutter groove 35 in the front-end portion (left end portion). The adhesive tape T is held down onto the tape receiving plate 29 by a tape holding plate 34. The tape holding plate 34 is arranged so as to move in the vertical direction by means of a cylinder 37. Further, the feed-out section 14 is arranged so as to move entirely in the vertical direction by means of a cylinder 39 (refer to FIG. 1).

The peeling head 15 is arranged so as to move in the vertical and horizontal directions via a cylinder or the like (not shown). The peeling head 15 includes a chuck 40 having an upper jaw 40A and a lower jaw 40B; and is arranged so that the upper jaw 40A is vertically moved by means of a cylinder (not shown) and thereby the chuck 40 is caused to open/close. In this embodiment, the peeling head 15 is provided with sensors 41, 41 for detecting if the adhesive tape T resides within the chuck 40. In addition, the peeling head 15 is arranged so as, when peeling off the protective sheet S, to move from one end portion to the other end portion in the diameter direction of the protective sheet S and thereby the protective sheet S is peeled off in an obtuse angled direction (refer to θ1 in FIG. 7).

The heater cutter unit 16 is arranged so as to move vertically via a cylinder (not shown), and is provided with a heater block 43 incorporating a heater 42. In the lower end of the heater cutter unit 16, a projection 44 for locally imparting a heat is provided. Also, the heater block 43 is attached to a frame 46 to be movable freely in the vertical direction via a guide bar 45, and arranged so as to move vertically by means of a cylinder 47 fixed to the frame 46. Two pieces of plate-like tape holder guides 49, 49 are attached to the frame 46 sandwiching the heater block 43 at the right and left sides. The lower end of these tape holder guides 49, 49 is formed in a curved face respectively and arranged so as to press the adhesive tape T on the upper surface thereof. On the right side face of the tape holder guide 49 shown in FIG. 2, a cutter travel cylinder 50 is attached, and in the lower end portion, a cutter blade 52 is attached thereto in a state protruding downwardly. The cutter blade 52 is arranged to be able to reciprocate vertically being driven by the cutter travel cylinder 50. Further, in the lower portion of the side face of the right tape holder guide 49, a plate-like tape holding member 53 is disposed; and in the tape-holding member 53, a slot 55 is formed for allowing the cutter blade 52 to vertically move therethrough.

Incidentally, the sheet peeling apparatus 10 according to this embodiment has substantially the same structure as that of the apparatus disclosed in the Japanese Patent Application Laid-open No. Hei 11-16862, which was applied by the applicant of the present invention, excluding a point of the supporting member 19, the first peeling unit etc disposed in the front face side area.

The supporting member 19 forming the disposing area for the first and second rollers 21, 22 constituting the first peeling unit are provided movably in the vertical direction; and the first roller 21 is provided rotatably being connected with the output shaft of a motor (not shown) The first roller 21 is provided movably in the horizontal direction via a cylinder (not shown), supporting member and the like along with the second roller 22. The rollers 21, 22 are arranged to move from the one end side to the other end side in the diameter direction of the protective sheet S, whereby the protective sheet S is peeled off from the wafer W. In this embodiment, although the first roller 21 is formed slightly smaller than the second roller 22 in diameter, the first roller 21 can be exchanged with different rollers of different diameter. Here, the first roller 21 is disposed at a position closer to the wafer W; and the second roller 22 is positioned at the left side in the opposite direction where the first roller 21 moves to perform the peeling off operation; i.e., the right direction in FIG. 1, and at an upper position away from the wafer W than the first roller 21. Owing to this, it is arranged so that, when the protective sheet S is peeled off, the peeling angle θ2 (refer to FIG. 13) with respect to the upper surface of the protective sheet S forms a substantially right or acute angle. To be more specifically, in this embodiment, it is arranged so that, a virtual line connecting the left end of the periphery of the first roller 21 with the right end of the periphery of the second roller 22; i.e., the winding direction of the protective sheet S between the first and second rollers 21, 22 resides on a substantially vertical line or in the direction where the upper portion is slightly inclined leftward with respect to the vertical line. In addition, the distance between the first and second rollers 21, 22 can be variously changed, if necessary. Owing to this, the distance between the first and second rollers 21, 22 can be increased.

In the front face side of the supporting member 19, a tape holding roller 60 and a press roller 61 are supported at the peeling head 15 side. The tape holding roller 60 presses the sticking-start end side to stick the adhesive tape T to the wafer W. The press roller 61 moves while rolling from a position close to the tape holding roller 60 in the diameter direction of the wafer W to lay the adhesive tape T across the surface of the wafer W and imparts a predetermined sticking pressure thereto. The press roller 61 is also provided movably in the horizontal direction via a cylinder, a supporting member and the like (not shown) in the same manner as the first and second rollers 21, 22.

Further, in a position above the first and second rollers 21, 22, a winding roller 64 for winding protective sheet S peeled off by the rollers 21, 22 is supported. Between the winding roller 64 and the second roller 22, guide rollers 65, 66 and a pinch roller 67 are disposed.

Next, a peeling method using the peeling head and a peeling method using the first and second rollers will be described.

Peeling Method Using the Peeling Head (Second Peeling Unit)

Since a peeling operation using a peeling head is substantially the same as that of an apparatus disclosed in the Japanese Patent Application Laid-open No. Hei 11-16862, the description thereof will be made simply.

First of all, a wafer W, which is disposed in an inside area of a ring frame F via a dicing tape DT and stuck with a protective sheet S onto an upper face side thereof, is sucked and held on a table 23 in a state being set on the table 23 as indicated with a broken line in FIG. 1, and the table 23 moves to a place beneath a feed-out section 14.

Figure 3:
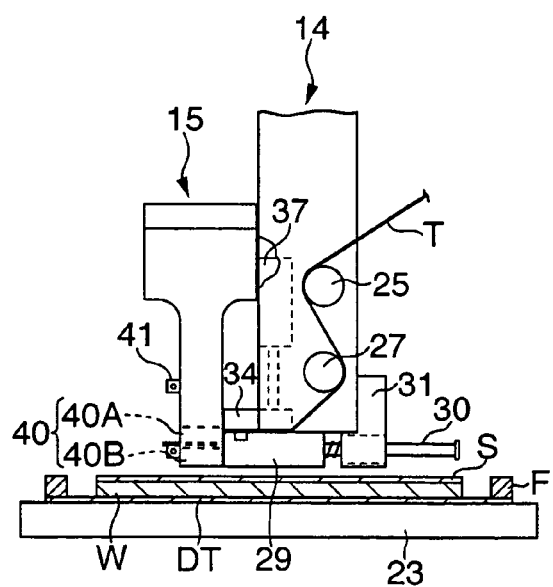
FIG. 3 is a front elevation view showing the essential part when the peeling head holds the front-end portion of an adhesive tape.

An adhesive tape T fed out from the feed-out section 14 is set so that the front end thereof is positioned almost directly below the cutter blade 52 in a state the front-end side thereof is nipped by a tape receiving plate 29 and a tape holding plate 34 (refer to FIG. 2). Then, the feed-out section 14 descends to position close to the table 23 as shown in FIG. 3; and in a state a chuck 40 is opened, apeeling head 15 moves to the feed-out section 14 side to push the tape receiving plate 29 to backward. Owing to this, the front-end portion of the adhesive tape T enters into the chuck 40, and the front-end portion of the adhesive tape T can be held by closing the chuck 40. In this peeling method, as the adhesive tape T, an adhesive tape having a heat sensitive adhesive layer on one surface; for example, a strip tape consisted of polyethylene terephthalate or the like is used.

Figure 4:
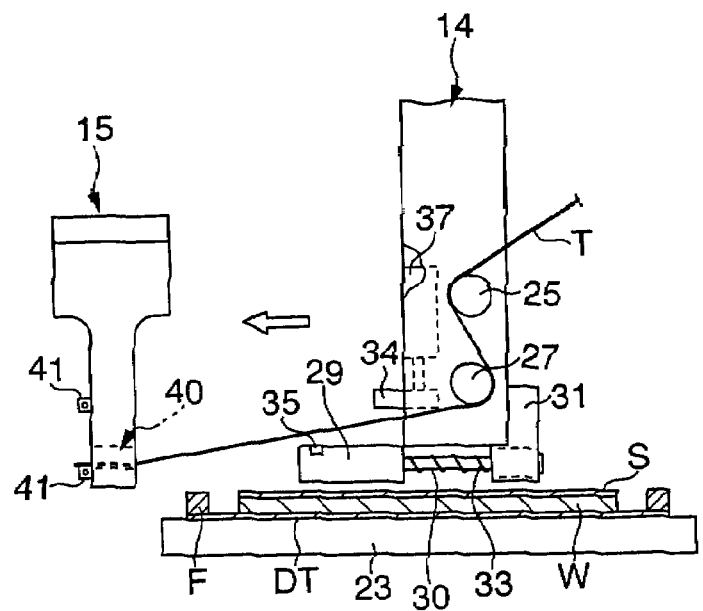
FIG. 4 is a front elevation view of the essential part illustrating an operation of the peeling head to pull out the adhesive tape.
Figure 5:
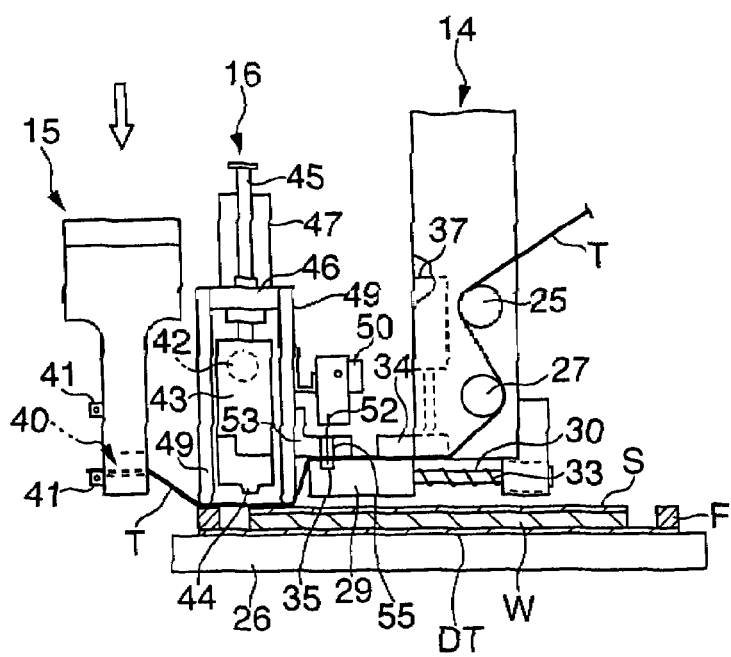
FIG. 5 is a front elevation view of the essential part illustrating a state the adhesive tape is fusion-bonded to a protective sheet and cut off.
Figure 6:
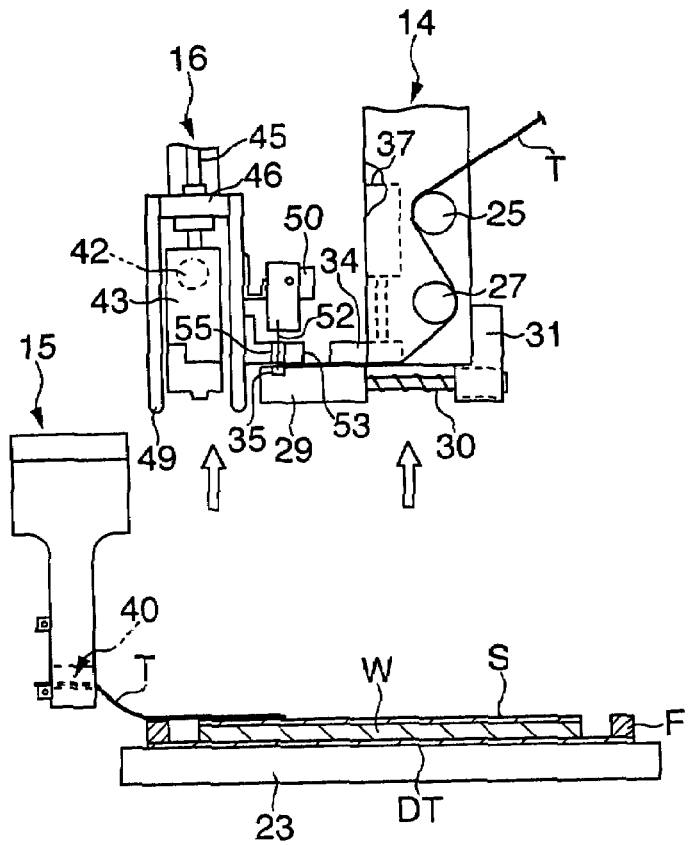
FIG. 6 is a front elevation view of the essential part illustrating a state the cut adhesive tape is fusion-bonded to the protective sheet.

Then, the peeling head 15 moves a predetermined amount leftward away from the feed-out section 14 to pull out the adhesive tape T a specific amount as shown in FIG. 4. Thus, in a state the adhesive tape T is pulled out, a heater cutter unit 16 descends to press the adhesive tape T from above at two points with tape holder guides 49, 49 as shown in FIG. 5; and a heater block 43 is lowered to stick the adhesive tape T to a protective sheet S with a projection 44. At the same time, the cutter blade 52 descends to cut off the adhesive tape T, and then the feed-out section 14 and the heater cutter unit 16 are raised (refer to FIG. 6). Then, when the peeling head 15 moves rightward as shown in FIG. 7, the protective sheet S is peeled off at an obtuse peeling angle θ1, and the peeled protective sheet S is dropped into a disposal box (not shown).

Peeling Method Using First and Second Rollers (First Peeling Unit)

Figure 8:
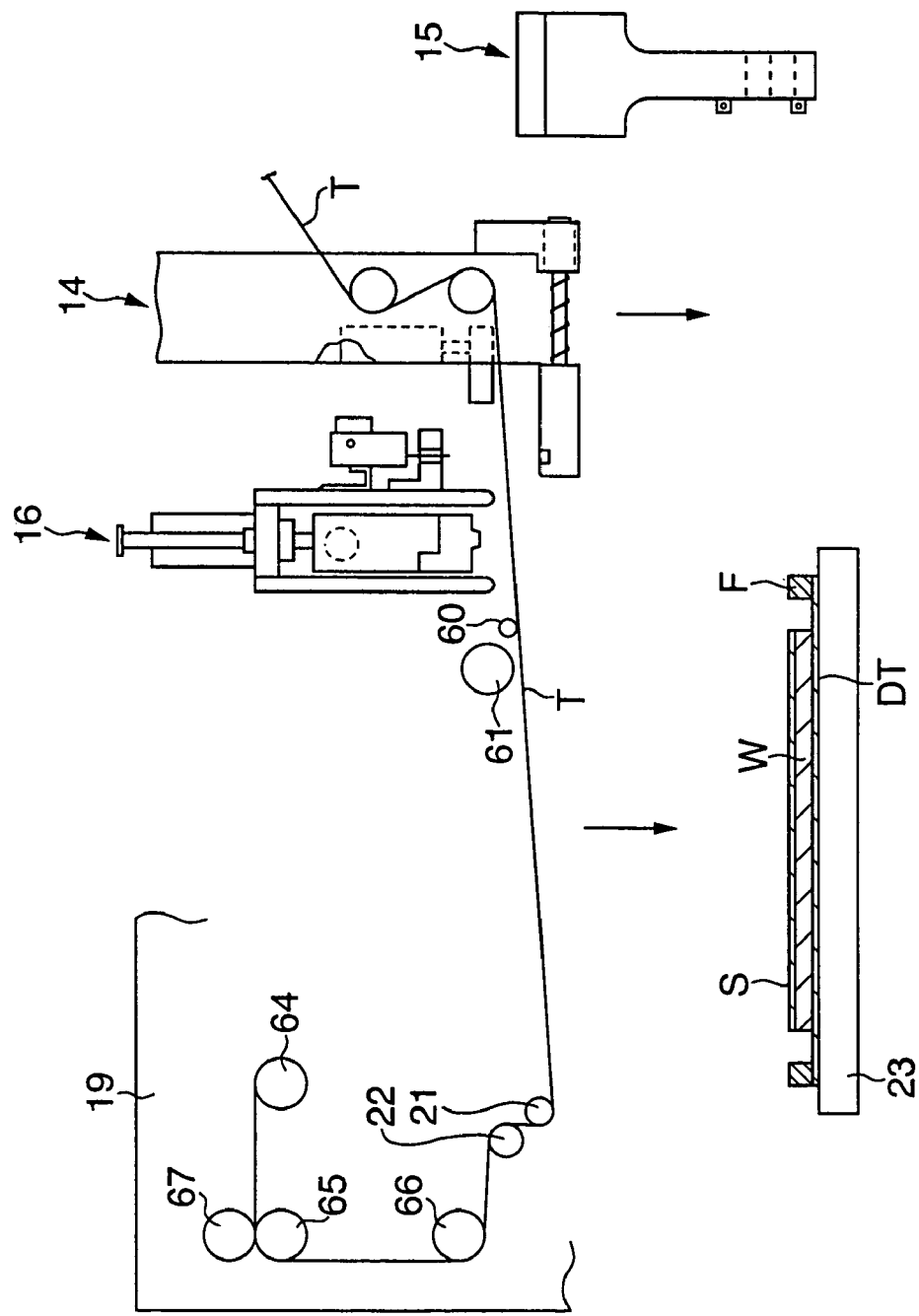
FIG. 8 is a front elevation view of the essential part when a first peeling unit peels off the protective sheet.

When carrying out this method, a tape consisted of a pressure-sensitive adhesive layer on one side thereof is employed as an adhesive tape T. The adhesive tape T is set onto a feed-out section 14 so that an adhesive layer faces a protective sheet S side as shown in FIG. 8, and the tape is pulled out a predetermined length and laid around along its path, and the front end portion thereof is fixed to a winding roller 64 as a preparation step. At this time, a peeling head 15 is moved to an escaping position at a further right side position exceeding the feed-out section 14. A roller, which comes into contact with an adhesive face, is treated on its surface to prevent the adhesive from adhering thereto.

Figure 9:
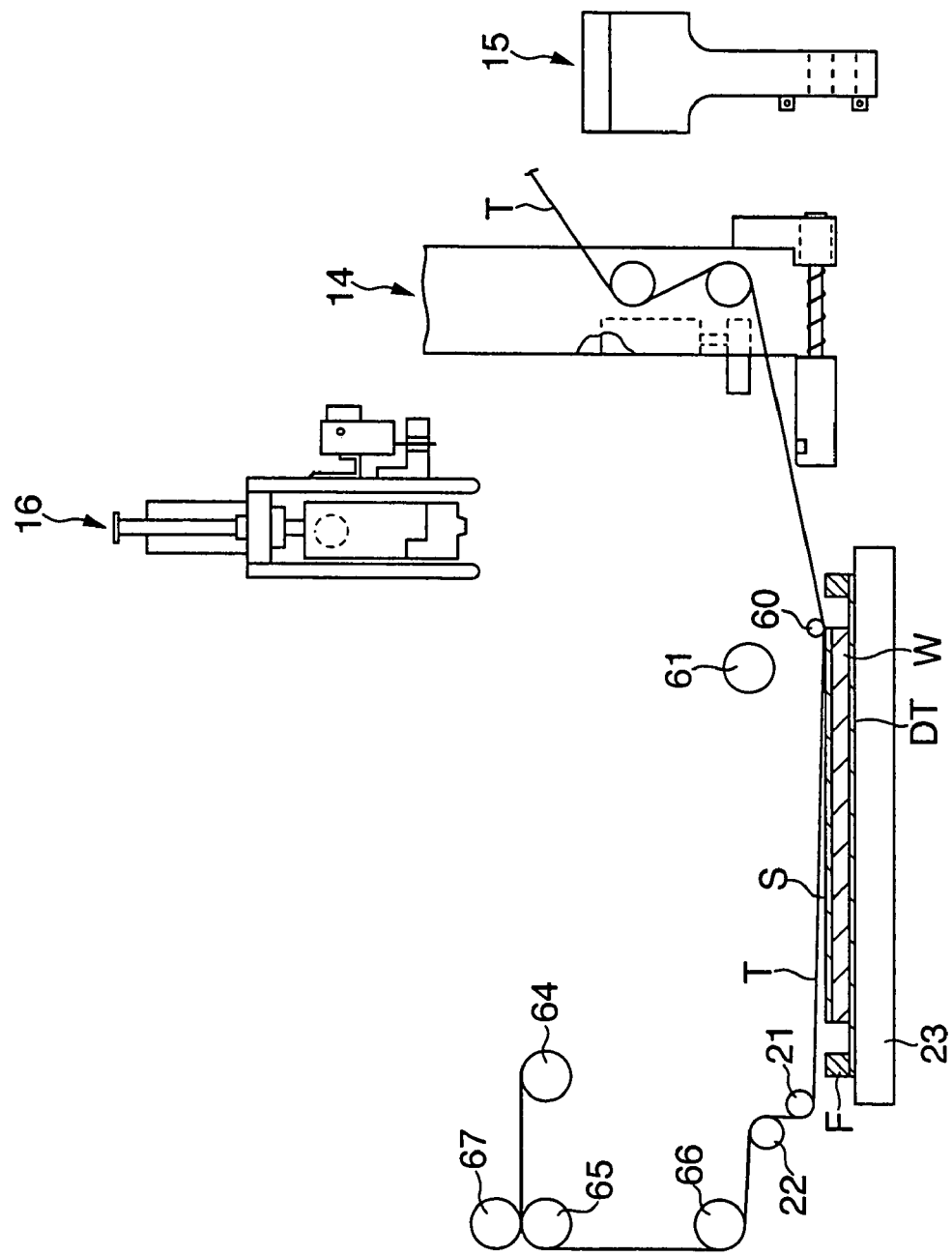
FIG. 9 is a front elevation view of the essential part illustrating a state the adhesive tape is pressed onto the protective sheet by a tape holding roller.

Then, a table 23 is moved and adjusted so that the right-end side of a wafer W is positioned almost directly below a tape holding roller 60. In such a state, the feed-out section 14 and a supporting member 19 descend to bring the adhesive tape T between the feed-out section 14 and a first roller 21 closer to the protective sheet S as shown in FIG. 9. And then, the tape holding roller 60 is lowered via a cylinder (not shown) to press a portion of the adhesive tape T onto the protective sheet S while sandwiching the same therebetween.

Figure 10:
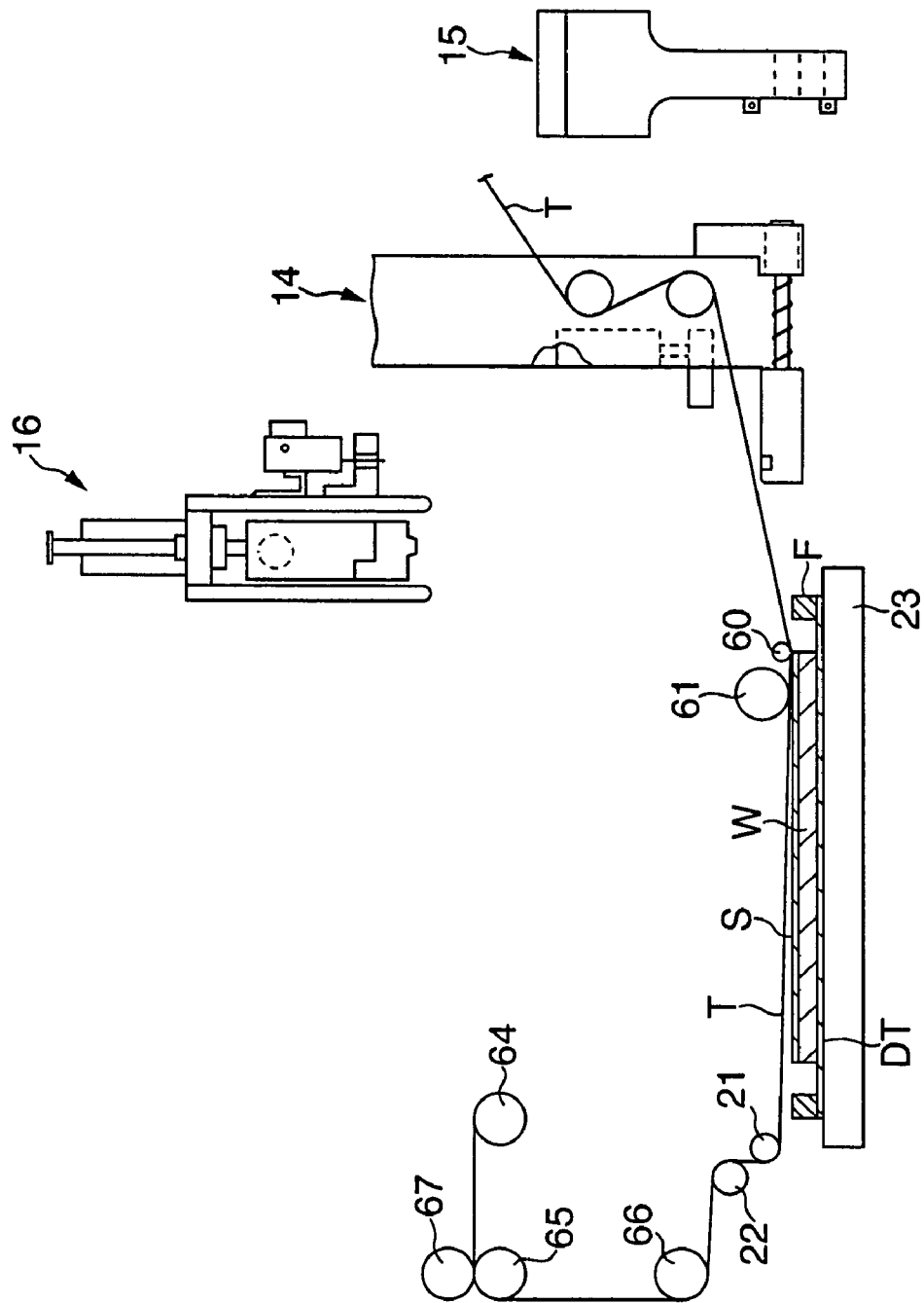
FIG. 10 is a front elevation view of the essential part illustrating an initial stage the adhesive tape is stuck to the protective sheet by a press roller.
Figure 11:
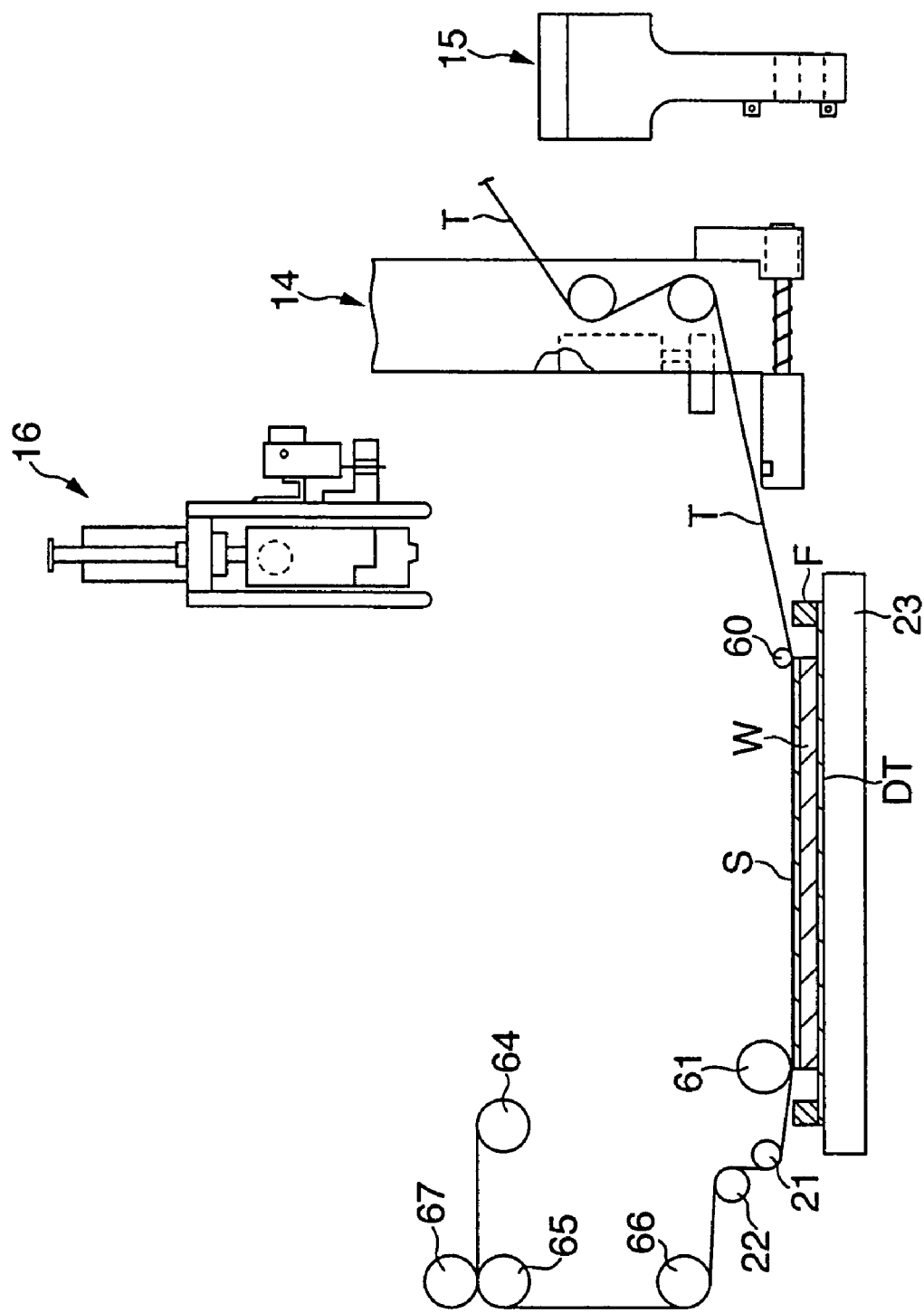
FIG. 11 is a front elevation view of the essential part illustrating a state the adhesive tape is stuck to the protective sheet across the same.
Figure 12:
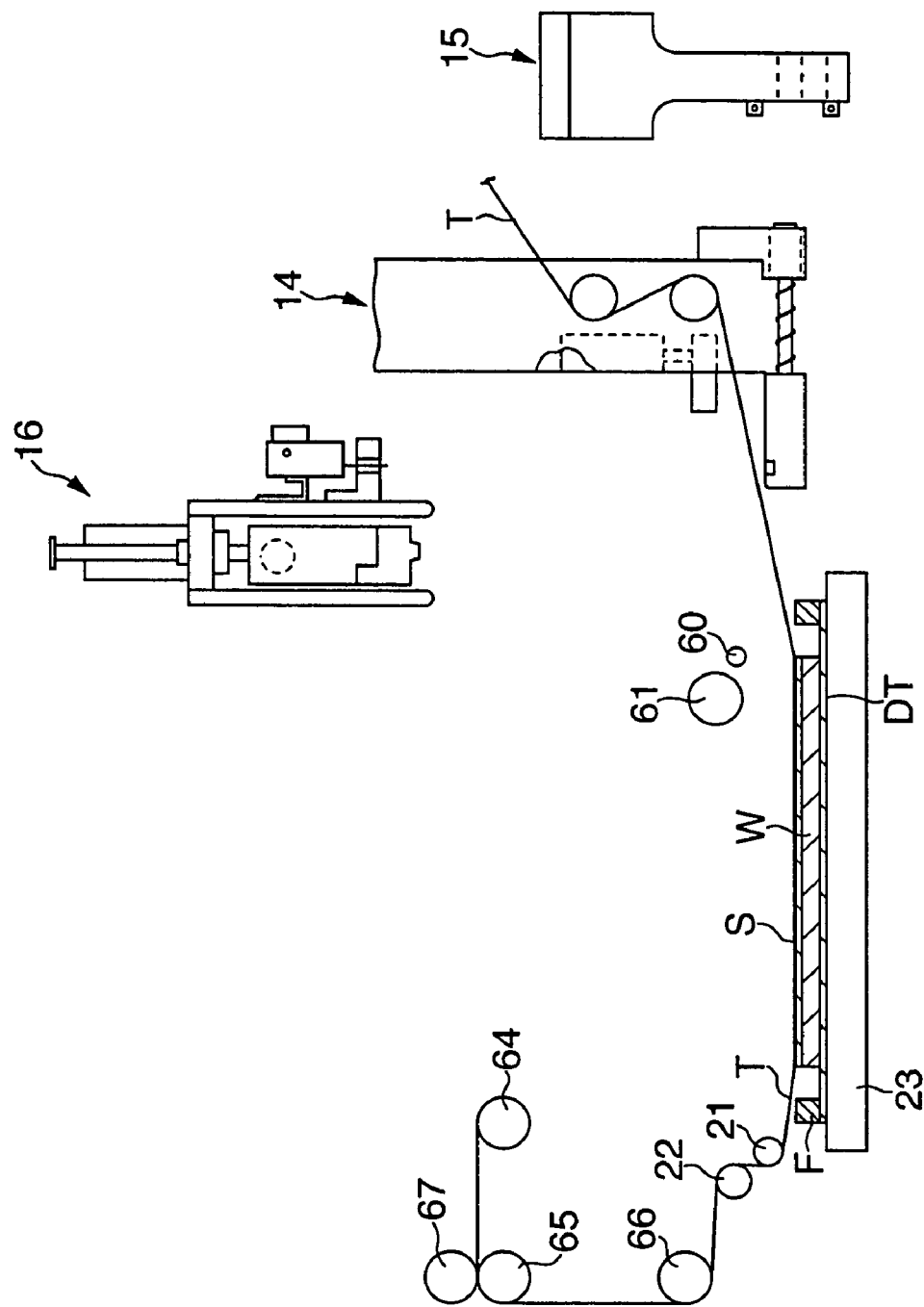
FIG. 12 is a front elevation view of the essential part illustrating an initial state to peel off the protective sheet with the first and second rollers.

Then, a press roller 61 is lowered via a cylinder (not shown) and moved leftward as shown in FIGS. 10 and 11, and the adhesive tape T is stuck across the upper surface of the protective sheet S. When the sticking operation of the adhesive tape T has completed, the tape holding roller 60 and the press roller 61 return to the initial position (refer to FIG. 12).

Then, the first roller 21 and a second roller 22 are moved rightward via the cylinder (not shown) as shown in FIG. 13. At the same time, the first roller 21 and the winding roller 64 are rotated in the tape winding direction by a motor (not shown) respectively. In this case, owing to the above-described relative positions of the first roller 21 and the second roller 22, the adhesive tape T is peeled off forming a peeling angle θ2 which rises up directly above with substantially right angle with respect to the upper surface of the protective sheet S; i.e., the upper surface of the wafer W. That is, the first and second rollers 21, 22 (first peeling unit) peel off the protective sheet S at the peeling angle θ2 of substantially right angle or acute angle; while the peeling head 15 (second peeling unit) peels off the protective sheet S at the peeling angle θ1 of obtuse direction close to substantially 180°, which is larger than that of the above.

Therefore, according to the embodiment as described above, such advantage that the first and second peeling units can be selectively used depending on the thickness and the material of the protective sheet S. To be more specific, in the case where the adhesive tape T is suitable for sticking to the protective sheet S in a manner of heat fusion sticking and the peeling at an obtuse angle is possible without causing elongation of the protective sheet S or the like, the sheet can be peeled off with a smaller adhesive tape T by carrying out the peeling using the peeling head 15. On the other hand, in the case where the adhesive tape T is not suitable for fusion-bond due to the relationship with the protective sheet S, or the adhesive tape T is not suitable for the obtuse peeling due to the protective sheet S formed with a thick base material, the protective sheet S can be peeled off by using the first peeling unit.

Also, since the feed-out section 14 can be commonly used in selection of the peeling methods, only by adding the first peeling unit to the previously proposed apparatus, optimum peeling can be achieved.

The best structure and method for carrying out the present invention have been disclosed so far. However, the present invention is not limited to the above.

That is, the present invention has been illustrated and described about mainly a specific embodiment. However, it is possible for a person skilled in the art to add various modifications to the above-described embodiment with respect to the configuration, material, quantity or detailed structure without departing from the technical spirit and the range of the object of the present invention.

Therefore, the descriptions limiting the configuration and material disclosed above are given for the purpose of illustrating only to facilitate the understanding of the present invention, but not intended to limit the present invention. Accordingly, the descriptions using appellations of members in which all or a part of these limitations on the configuration and the material are different should be understood to be included within the present invention.

For example, in the embodiment, there is employed the arrangement in which the heat sensitive adhesive tape T is stuck to the protective sheet S in a manner of fusion-bonding to peel off the protective sheet S using the peeling head 15. However, an adhesive tape having a pressure sensitive adhesive layer may be used. In this case, by carrying out surface treatment on the component of the feed-out section, which comes into contact with the adhesive layer, to prevent from sticking, the tape can be fed out free from trouble.

Further, there is employed such an arrangement that, when peeling off the protective sheet S using the first and second rollers 21, 22, the rollers 21, 22 move along and across the diameter direction of the wafer W. However, such an arrangement that the table 23 is moved to peel off the protective sheet S without moving the rollers 21, 22, may be employed. In this case, the tape holding roller 60 has to be arranged only to keep a state pressing the adhesive tape T.

The present invention is applicable, particularly, to an apparatus for peeling off a tape covering the circuit surface in the manufacturing process of semiconductor wafer.

The invention claimed is:

1. A sheet peeling apparatus for peeling off a sheet being stuck on an object using an adhesive tape, comprising:
    a first peeling unit that pulls said adhesive tape along the direction across said sheet in a state stuck to the sheet to peel off the sheet at a predetermined peeling angle; and
    a second peeling unit that pulls said adhesive tape in a state stuck to the end portion of said sheet to peel off the sheet at a peeling angle different from said peeling angle,
    wherein said first and second peeling units are arranged to be selectively used.

2. The sheet peeling apparatus according to claim 1, wherein said object has a plate shape.

3. A sheet peeling apparatus for peeling off a sheet being stuck to cover the surface of a semiconductor wafer using an adhesive tape of a width narrower than the diameter of the sheet, comprising:
- a first peeling unit that pulls said adhesive tape along the direction across said sheet in a state stuck to the sheet to peel off the sheet at a predetermined peeling angle; and
- a second peeling unit that pulls said adhesive tape in a state stuck to the end portion of said sheet to peel off the sheet at a peeling angle different from said peeling angle,
- wherein said first and second peeling units are arranged to be selectively used.

4. The sheet peeling apparatus according to claim 1 or 3, wherein said first peeling unit peels off said sheet in a direction substantially right angle or acute angle with respect to the surface of said plate-like object.

5. The sheet peeling apparatus according to claim 2 or 3, wherein said second peeling unit peels off said sheet at a peeling angle larger than the peeling angle by said first peeling unit.

6. The sheet peeling method apparatus to claim 3, wherein said semiconductor wafer has a disk shape.

7. A sheet peeling method of peeling off a sheet stuck on an object using an adhesive tape, the method comprising:
- a first peeling unit that pulls said adhesive tape along the direction across said sheet in a state stuck to the sheet to peel off the sheet at a predetermined peeling angle; and
- a second peeling unit that pulls said adhesive tape in a state stuck to the end portion of said sheet to peel off the sheet at a peeling angle different from said peeling angle, wherein,
- said first and second peeling units are selectively used to peel off said sheet.

8. The sheet peeling method according to claim 7, wherein said first peeling unit peels off said sheet in the substantially right angle or acute angle direction with respect to the surface of said plate-like object, and said second peeling unit peels off said sheet at a peeling angle larger than the peeling angle by said first peeling unit.

9. The sheet peeling method according to claim 7, wherein said object has a plate shape.

* * * * *